(12) United States Patent
Moloudi

(10) Patent No.: US 8,838,033 B2
(45) Date of Patent: Sep. 16, 2014

(54) SYSTEM AND METHOD FOR SIGNAL AMPLIFICATION

(75) Inventor: Shervin Moloudi, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 3413 days.

(21) Appl. No.: 11/005,837

(22) Filed: Dec. 7, 2004

(65) Prior Publication Data

US 2005/0100084 A1    May 12, 2005

Related U.S. Application Data

(63) Continuation-in-part of application No. 09/634,552, filed on Aug. 8, 2000, now Pat. No. 7,555,263, which is a continuation-in-part of application No. 10/409,213, filed on Apr. 8, 2003, now Pat. No. 6,801,092, and a continuation-in-part of application No. 10/957,043, filed on Oct. 1, 2004, now Pat. No. 8,014,724.

(60) Provisional application No. 60/160,806, filed on Oct. 21, 1999, provisional application No. 60/163,487, filed on Nov. 4, 1999, provisional application No. 60/163,398, filed on Nov. 4, 1999, provisional application No. 60/164,442, filed on Nov. 9, 1999, provisional application No. 60/164,194, filed on Nov. 9, 1999, provisional application No. 60/164,314, filed on Nov. 9, 1999, provisional application No. 60/165,234, filed on Nov. 11, 1999, provisional application No. 60/165,239, filed on Nov. 11, 1999, provisional application No. 60/165,356, filed on Nov. 12, 1999, provisional application No. 60/165,355, filed on Nov. 12, 1999, provisional application No. 60/172,348, filed on Dec. 16, 1999, provisional application No. 60/201,335, filed on May 2, 2000, provisional application No. 60/201,157, filed on May 2, 2000, provisional application No. 60/201,179, filed on May 2, 2000, provisional application No. 60/202,997, filed on May 10, 2000, provisional application No. 60/201,330, filed on May 2, 2000.

(51) Int. Cl.
*H04B 1/00* (2006.01)

(52) U.S. Cl.
USPC ............ 455/63.1; 455/296; 455/20; 455/118; 455/306; 455/258; 455/323; 375/224; 375/148; 375/322; 375/285; 375/346; 331/11; 331/16; 369/44.34; 369/44.41

(58) Field of Classification Search
USPC ........... 455/63.1, 20, 296, 118, 306, 258, 323
See application file for complete search history.

(56) References Cited

U.S. PATENT DOCUMENTS 5,375,146 A * 12/1994 Chalmers ...................... 375/350
5,572,551 A * 11/1996 Kearney et al. ................ 375/326

(Continued)

*Primary Examiner* — Marceau Milord
(74) *Attorney, Agent, or Firm* — Sterne, Kessler, Goldstein & Fox P.L.L.C.

(57) ABSTRACT

Methods and systems for processing a signal with a corresponding noise profile are disclosed. Aspects of the method may comprise analyzing spectral content of the noise profile. At least one noise harmonic within the signal may be filtered based on said analyzed spectral content. The filtered signal may be amplified. The noise profile may comprise a phase noise profile. The signal may comprise at least one of a sinusoidal signal and a noise signal. At least one filter coefficient that is used to filter the at least one noise harmonic may be determined. The filtering may comprise low pass filtering. The signal may be modulated prior to filtering. The amplifying may comprise buffering. A non-linearity characteristic of the signal may be determined and a noise harmonic may be low-pass filtered within the signal based on the determined non-linearity characteristic.

14 Claims, 14 Drawing Sheets

(56) References Cited

U.S. PATENT DOCUMENTS

| | | | | |
|---|---|---|---|---|
| 5,583,892 A | * | 12/1996 | Drakul et al. | 375/353 |
| 5,734,674 A | * | 3/1998 | Fenton et al. | 375/150 |
| 5,940,435 A | * | 8/1999 | Hendrickson | 375/147 |
| 5,995,539 A | * | 11/1999 | Miller | 375/222 |
| 6,011,824 A | * | 1/2000 | Oikawa et al. | 375/377 |
| 6,061,551 A | * | 5/2000 | Sorrells et al. | 455/118 |
| 6,091,940 A | * | 7/2000 | Sorrells et al. | 455/118 |
| 6,111,911 A | * | 8/2000 | Sanderford et al. | 375/147 |
| 6,154,484 A | * | 11/2000 | Lee et al. | 375/130 |
| 6,212,246 B1 | * | 4/2001 | Hendrickson | 375/355 |
| 6,219,376 B1 | * | 4/2001 | Zhodzishsky et al. | 375/148 |
| 6,256,337 B1 | * | 7/2001 | Hendrickson et al. | 375/140 |
| 6,263,017 B1 | * | 7/2001 | Miller | 375/222 |
| 6,304,623 B1 | * | 10/2001 | Richards et al. | 375/355 |
| 6,353,735 B1 | * | 3/2002 | Sorrells et al. | 455/118 |
| 6,532,256 B2 | * | 3/2003 | Miller | 375/222 |
| 6,563,859 B1 | * | 5/2003 | Oishi et al. | 375/148 |
| 6,577,691 B2 | * | 6/2003 | Richards et al. | 375/355 |
| 6,603,801 B1 | * | 8/2003 | Andren et al. | 375/147 |
| 6,603,830 B1 | * | 8/2003 | Finsterbusch et al. | 375/362 |
| 6,608,874 B1 | * | 8/2003 | Beidas et al. | 375/353 |
| 6,633,617 B1 | * | 10/2003 | Cooklev | 375/344 |
| 6,636,573 B2 | * | 10/2003 | Richards et al. | 375/355 |
| 6,678,310 B1 | * | 1/2004 | Andren et al. | 375/147 |
| 6,693,974 B2 | * | 2/2004 | Jin et al. | 375/297 |
| 6,757,334 B1 | * | 6/2004 | Feher | 375/259 |
| 6,765,931 B1 | * | 7/2004 | Rabenko et al. | 370/493 |
| 6,801,092 B1 | * | 10/2004 | Moloudi | 331/16 |
| 6,922,555 B1 | * | 7/2005 | Mohindra | 455/314 |
| 7,010,056 B1 | * | 3/2006 | McCorkle et al. | 375/295 |

* cited by examiner

SYSTEM AND METHOD FOR SIGNAL AMPLIFICATION

RELATED APPLICATIONS

The present application is a continuation-in-part of U.S. patent application Ser. No. 09/634,552, filed Aug. 8, 2000 which claims benefit from and priority to U.S. Patent Application Ser. No. 60/160,806, filed Oct. 21, 1999; Application No. 60/163,487, filed Nov. 4, 1999; Application No. 60/163,398, filed Nov. 4, 1999; Application No. 60/164,442, filed Nov. 9, 1999; Application No. 60/164,194, filed Nov. 9, 1999; Application No. 60/164,314, filed Nov. 9, 1999; Application No. 60/165,234, filed Nov. 11, 1999; Application No. 60/165,239, filed Nov. 11, 1999; Application No. 60/165,356; filed Nov. 12, 1999; Application No. 60/165,355, filed Nov. 12, 1999; Application No. 60/172,348, filed Dec. 16, 1999; Application No. 60/201,335, filed May 2, 2000; Application No. 60/201,157, filed May 2, 2000; Application No. 60/201,179, filed May 2, 2000; Application No. 60/202,997, filed May 10, 2000; Application No. 60/201,330, filed May 2, 2000. The above referenced applications are hereby incorporated herein by reference in their entireties.

The present application is also a continuation-in-part of U.S. patent application Ser. No. 10/409,213, filed Apr. 3, 2003 and entitled "Phase Locked Loop That Avoids False Locking," and U.S. patent application Ser. No. 10/957,043, filed Oct. 1, 2004 and entitled "System And Method For Signal Limiting," the complete subject matters of which are hereby incorporated herein by reference in their entireties.

This application is related to the following applications, each of which is incorporated herein by reference in its entirety for all purposes:
U.S. patent application Ser. No. 10/409,213, filed Apr. 3, 2003;
U.S. patent application Ser. No. 09/634,552, filed Aug. 8, 2000;
U.S. patent application Ser. No. 10/813,486, filed Mar. 30, 2004; and
U.S. patent application Ser. No. 10/957,043, filed Oct. 1, 2004.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Spectral purity and reduced phase noise are becoming an inseparable requirement of signal generation and amplification circuits. Most modern communication systems, in particular, employ amplifiers that may be implemented as buffers and/or low-noise amplifiers (LNAs), for example, and are characterized with corresponding performance specifications. Those specifications normally dictate the performance of individual blocks, including voltage controlled oscillators (VCOs), dividers, etc. Traditionally, the noise and spectral profile of different blocks are included in a linear, phase domain AC-type analysis, or simulation, to estimate final spectral performance. Such analysis, however, ignores the nonlinear effects in the signal generation path, including an amplifying action by an amplifier, for example.

During operation of a conventional VCO, the VCO output is buffered before it is applied to the next stage. The buffer can be implemented as a power amplifier designed to deliver the signal to an off-chip load, or it may also be implemented as a simple tuned stage that sits between the VCO and a divider, for example. Because of the non-linear effect in the signal amplifier/buffer within an electric circuit containing a conventional VCO, for example, and the resulting phase noise profile, as outlined below, an amplifying action by an amplifier may substantially increase the phase noise profile of the generated signal at the output of the amplifier.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Aspects of the present invention may be found in a method and system for processing a signal with a corresponding noise profile. Aspects of the method may comprise analyzing spectral content of the noise profile. At least one noise harmonic within the signal may be filtered based on said analyzed spectral content. The filtered signal may be amplified. The noise profile may comprise a phase noise profile. The signal may comprise at least one of a sinusoidal signal and a noise signal. At least one filter coefficient that is used to filter the at least one noise harmonic may be determined.

The filtering may comprise low pass filtering. The signal may be modulated prior to filtering. The amplifying may comprise buffering. A non-linearity characteristic of the signal may be determined and a noise harmonic may be low-pass filtered within the signal based on the determined non-linearity characteristic. The non-linearity characteristic may comprise a noise harmonic frequency and/or a noise harmonic amplitude. The spectral content may comprise an input noise spectrum and/or an output noise spectrum.

Aspects of the system may comprise a processor that analyzes spectral content of the noise profile. A filter may filter at least one noise harmonic within the signal based on the analyzed spectral content. An amplifier may amplify the filtered signal. The noise profile may comprise a phase noise profile and the signal may comprise a sinusoidal signal and/or a noise signal. The processor may determine a filter coefficient that is used to filter the noise harmonic. The filter may comprise a low-pass filter. The system may further comprising a modulator that modulates the signal prior to the filtering.

The amplifier may buffer the filtered signal. The processor may determine a non-linearity characteristics of the signal and the filter may low-pass filters the noise harmonic within the signal based on the determined non-linearity characteristic. The non-linearity characteristic may comprise a noise harmonic frequency and/or a noise harmonic amplitude. The spectral content may comprise an input noise spectrum and/or an output noise spectrum.

These and other features and advantages of the present invention may be appreciated from a review of the following detailed description of the present invention, along with the accompanying figures in which like reference numerals refer to like parts throughout.

DETAILED DESCRIPTION OF THE INVENTION

Figure 1:
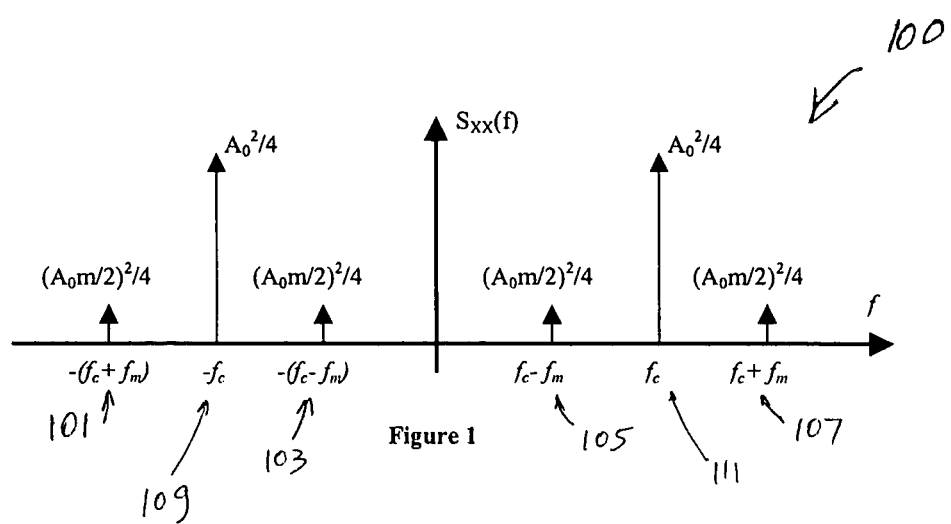
FIG. 1 is a graphical representation of power spectral density (PSD) for a noise-containing sinusoidal signal, in accordance with an embodiment of the invention.

An amplifier, or a buffer, may comprise an amplifying active device with a certain level of nonlinearity, followed by a tuned stage, for example. In one aspect of the invention, a general technique for analyzing a mildly nonlinear buffer/amplifier may be developed through solving a typical implementation with long channel CMOS devices. In a different aspect of the invention, a resulting technique for reducing phase noise prior to amplification may be implemented. For example, a processor may be utilized prior to amplification by the amplifier to analyze one or more noise characteristics of an incoming signal. A filter, such as a low-pass filter, may then be utilized to filter one or more noise characteristics, such as a noise harmonic signal, from the analyzed signal prior to amplification.

Nonlinear operations within an electric circuit, such as amplifying, may cause distortion and aliasing in the signal and noise spectrum. In particular, it may be established for a hard-limiter, for example, that a limiting action by the hard-limiter may cause infinite folding and generation of harmonics at the output of the signal limiter. Similarly, it may be established that an amplifying action by an amplifier may also cause distortion and aliasing in the signal and noise spectrum.

In accordance with an aspect of the invention, certain techniques relating to the effect of non-linearity on phase noise profile and signal, which are illustrated below, may be utilized to predict the behavior of an electric signal as it traverses through a circuit comprising a limiter. It may be established that if the limiter gain is not infinite, the close-in phase noise may change depending on how sharp the limiter transitions are. In addition, these derivations may be utilized to predict the spectral properties of a signal within a circuit containing a limiter.

In another aspect of the invention, the phase noise profile of a sinusoidal signal within an electric circuit may be determined, prior to a limiting action by a limiter within the circuit. For example, spectral analysis may be utilized to analyze the spectral content of a noise profile of a given signal. One or more filter coefficients of a filter may then be generated based on the analyzed spectral content. The signal may then be filtered in accordance with the determined filter coefficients so that one or more phase noise characteristics, or perturbations, may be attenuated from the signal. In this way, after the filtered signal passes through a limiter, the infinite folding and generation of noise harmonics at the limiter output may be avoided.

The output of a signal generation circuit, such as a voltage controlled oscillator (VCO), may be represented by:

$$x(t) = A(t)\cos(2\pi f_c t + \phi(t)) \quad (1)$$

For an ideally sinusoidal signal source, $A(t)$ may be equal to a constant $A_0$, and $\phi(t)$ may be constant or equal to zero. If the signal phase varies with time in a sinusoidal fashion, the output of the signal generation circuit may be represented by:

$$x(t) = A_0 \cos(2\pi f_c t + m \sin 2\pi f_m t) \quad (2)$$

Utilizing frequency modulation (FM) theory, expression (2) may be further expanded in terms of modified Bessel functions. In this way, sinusoidal modulation of the phase may result in generation of sidebands at integer multiples of modulation frequency $f_m$ with respect to the center frequency $f_c$. If m is smaller than 1, the following small modulation index approximation may be inferred:

$$x(t) \approx A_0 \cos 2\pi f_c t + A_0 \frac{m}{2} [\cos 2\pi (f_c + f_m)t - \cos 2\pi (f_c - f_m)t] \quad (3)$$

FIG. 1 is a graphical representation 100 of power spectral density (PSD) for a noise-containing sinusoidal signal, in accordance with an embodiment of the invention. PSD may be undefined for a deterministic signal. However, a deterministic signal may be assumed to contain a small and negligible random process, such as noise. In this case, the PSD may be well defined. Referring to FIG. 1, the random noise may be reflected in frequency domain at frequencies 101, 103, 105, and 107, disposed around the mirror center frequency $-f_c$ 109 and $f_c$ 111.

Figure 2:
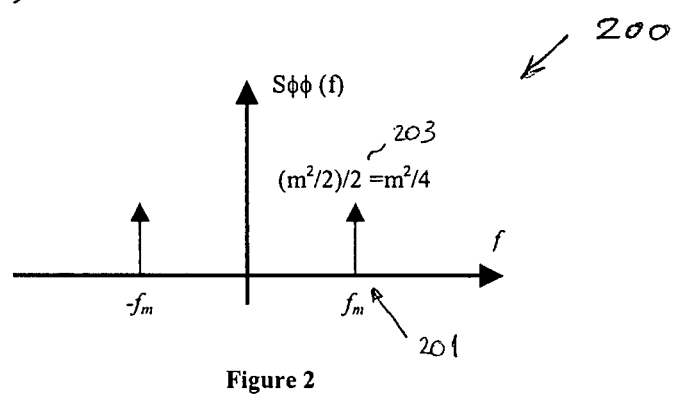
FIG. 2 is a graphical representation of the modulating phase of the sinusoidal signal of FIG. 1, in accordance with an embodiment of the invention.

FIG. 2 is a graphical representation 200 of the modulating phase of the sinusoidal signal of FIG. 1, in accordance with an embodiment of the invention. Referring to FIG. 2, there is illustrated a PSD 203 of a modulating phase $f_m$ 201. In the signal PSD, the phase PSD may be replicated around a carrier frequency $f_c$.

In a more general case:

$$x(t) = (A_0 + a(t)) \cdot \cos(2\pi f_c t + m \sin 2\pi f_m t) \quad (4)$$

Through the small modulation index approximation and the assumption that $a(t) \ll A_0$, equation (4) may be simplified to:

$$x(t) \approx A_0 \cos 2\pi f_c t + a(t) \cos 2\pi f_c t + \quad (5)$$
$$A_0 \frac{m}{2} [\cos 2\pi (f_c + f_m)t - \cos 2\pi (f_c - f_m)t]$$

In particular, for $a(t) = a_0 \cos 2\pi f_m t$:

$$x(t) = A_0 \cos 2\pi f_c t + \quad (6)$$
$$\left(\frac{a_0}{2} + A_0 \frac{m}{2}\right) \cos 2\pi (f_c + f_m)t + \left(\frac{a_0}{2} - A_0 \frac{m}{2}\right) \cos 2\pi (f_c - f_m)t$$

The sidebands created at the modulation frequency $f_m$ may be caused by amplitude modulation (AM) and/or phase modulation (PM). For small variations, AM and PM may be indistinguishable.

Figure 3:
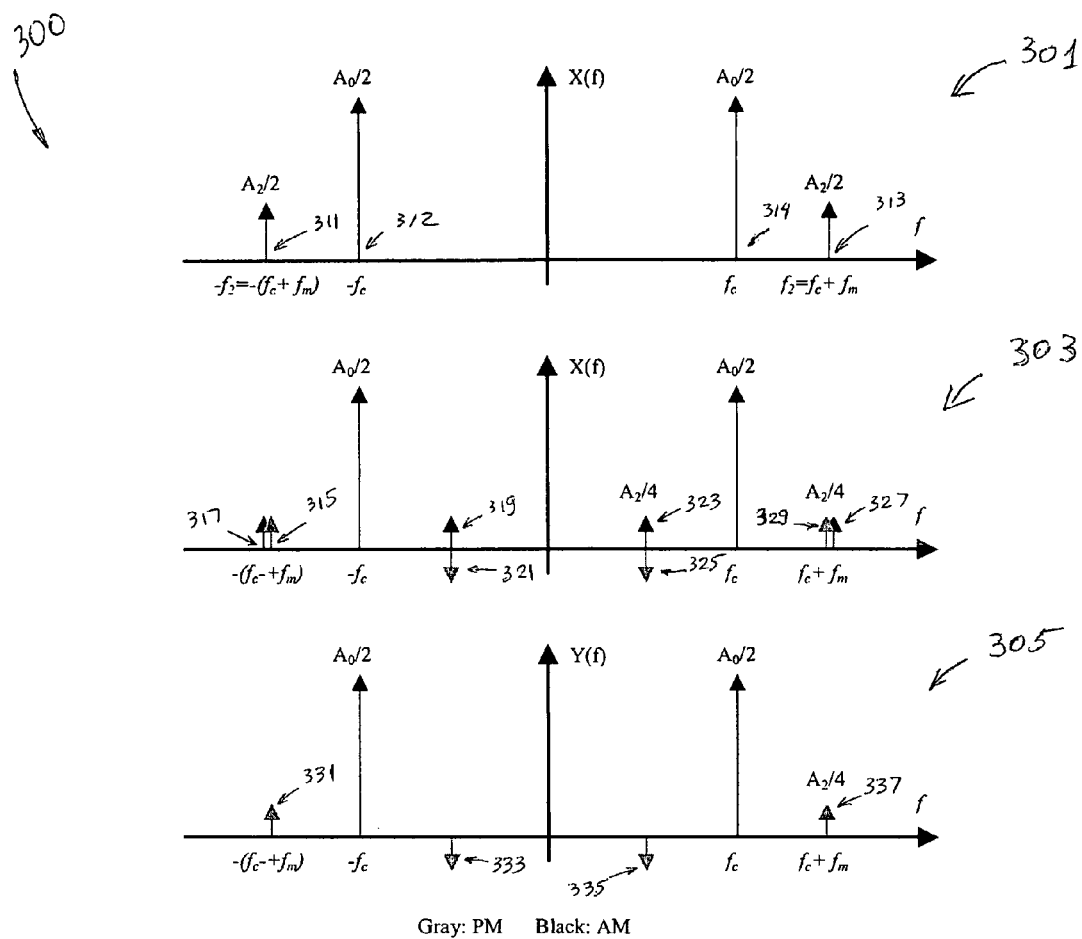
FIG. 3 is a graphical representation of phase modulation and amplitude modulation of a sinusoidal signal passed through a limiter, in accordance with an embodiment of the invention.

FIG. 3 is a graphical representation 300 of phase modulation and amplitude modulation of a sinusoidal signal passed through a limiter, in accordance with an embodiment of the invention. If a large sinusoidal wave is accompanied by a small one, it may be determined:

$$x(t) = A_0 co 2\pi f_c t + A_2 \cos 2\pi f_2 t \quad A_0 \gg A_2 \quad (7)$$

Equation (7) may be rearranged to yield:

$$x(t) = A_0 \cos 2\pi f_c t + \left(\frac{A_2}{2} + A_0 \frac{A_2}{2A_0}\right) \quad (8)$$

$$\cos [2\pi (f_c + (f_2 - f_c)]t + \left(\frac{A_2}{2} - A_0 \frac{A_2}{2A_0}\right) \cos [2\pi (f_c - (f_2 - f_c)]t$$

Utilizing equation (6), equation (8) may be represented as a sinusoidal wave with amplitude and phase modulation:

$$x(t) = (A_0 + a_0 \cos 2\pi f_m t) \cdot \cos(2\pi f_c t + m \sin 2\pi f_m t), \quad (9)$$
$$a_0 = A_2,$$
$$m = \frac{A_2}{A_0},$$
$$f_m = f_2 - f_c$$

If the amplitude modulation is suppressed, for example by passing the signal through a circuit, such as a limiter, which reacts to zero crossings, for example, the result may be a sinusoidal wave with phase modulation only. In this way, the passing of the signal through a circuit may result in two side bands:

$$y(t) = A_0 \cos 2\pi f_c t + \frac{A_2}{2} \cos 2\pi (f_c + f_m)t - \frac{A_2}{2} \cos 2\pi (f_c - f_m)t \quad (10)$$

Referring to FIG. 3, graphical representation 301 may illustrate a limiter input signal X(f) in frequency domain. The signal X(f) may comprise a carrier signal at a center frequency $f_c$ 314 and smaller sinusoidal signal at frequency $f_2$ 313. The mirror images of the center frequency $f_c$ and the sinusoidal signal at frequency $f_2$ may be located at frequencies $-f_c$ 312 and $-f_2$ 311.

The graphical representation 303 may illustrate decomposition of the small sinusoid within the signal X(f) into AM and PM components. For example, the small sinusoid at frequency $f_2$ 313 may be decomposed into AM components at frequencies 323 and 327, and PM components at frequencies 325 and 329. Similarly, the mirror image $-f_2$ 311 may be decomposed into AM components at frequencies 317 and 319, and PM components at frequencies 315 and 321.

The graphical representation 305 may represent, for example, AM to PM conversion within an exemplary output signal Y(f) of a limiter when an input signal X(f) is applied to it. As a result, the AM sidebands may be suppressed and two PM sidebands, at frequencies 335 and 337, may remain. PM sidebands 331 and 333 may correspond to sidebands 337 and 335, respectively.

Figure 4:
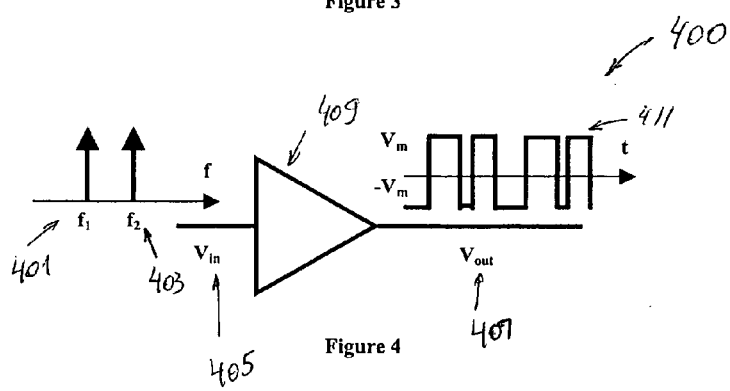
FIG. 4 is a schematic block diagram of a limiter, in accordance with an embodiment of the invention.

In order to obtain the spectrum at the output of a limiter in terms of its input, a limiter may be considered as a high-gain amplifier. FIG. 4 is a schematic block diagram 400 of a limiter, in accordance with an embodiment of the invention. Referring to FIG. 4, the limiter 409 may limit an input signal 405 to generate an output signal 407. The input signal 405 may comprise two sinusoidal signals 401 and 403 with equal amplitudes. The limiter output 407 may be represented by the timing diagram 411. In this way, the limiter output 407 may switch between a negative and a positive level, $-V_m$ and $V_m$ respectively, depending on weather the input is smaller or larger than zero. The input to the limiter may be represented by:

$$V_{in}(t) = A \sin(2\pi f_1 t) + A \sin(2\pi f_2 t + \theta) \quad (11)$$

Since the limiter 409 may only respond to the zero crossings of $V_{in}$, the amplitude A is irrelevant and only the relative amplitude of the two sinusoidal waves 401 and 403 may be considered. Zero crossings occur at $V_{in}=0$:

$$\sin(2\pi f_1 t) = \sin(-2\pi f_2 t - \theta) \qquad (12)$$

Two sets of answers satisfy this condition.

$$\begin{cases} 2\pi f_1 t = -2\pi f_2 t - \theta + 2k\pi \\ 2\pi f_1 t = \pi + 2\pi f_2 t + \theta + 2k\pi \end{cases} \rightarrow \begin{cases} 2\pi(f_1 + f_2)t = 2k\pi - \theta \\ 2\pi(f_1 - f_2)t = 2k\pi + \pi + \theta \end{cases} \qquad (13)$$

Therefore, the times at which zero crossing may happen are:

$$\begin{cases} t = \frac{1}{f_1 + f_2}\left(k - \frac{\theta}{2\pi}\right) = \frac{1}{f_+}\left(k - \frac{\theta}{2\pi}\right) \\ t = \frac{1}{f_1 - f_2}\left(k + \frac{\theta + \pi}{2\pi}\right) = \frac{1}{f_-}\left(k + \frac{\theta + \pi}{2\pi}\right) \end{cases} \qquad (14)$$

This means that the output crosses zero at any of these times. The output may be considered as a product of two square waves, one with a frequency of $f_-/2$, and the other with a frequency of $f_+/2$, each representing one of the two sets of solutions:

$$V_{out}(t) = V_m \times (V_{out+}(t) \times V_{out-}(t)) \qquad (15)$$

In frequency domain:

$$V_{out}(f) = V_m \times (V_{out+}(f) * V_{out-}(f)) \qquad (16)$$

In the above equation (16), "*" denotes convolution.

Figure 5:
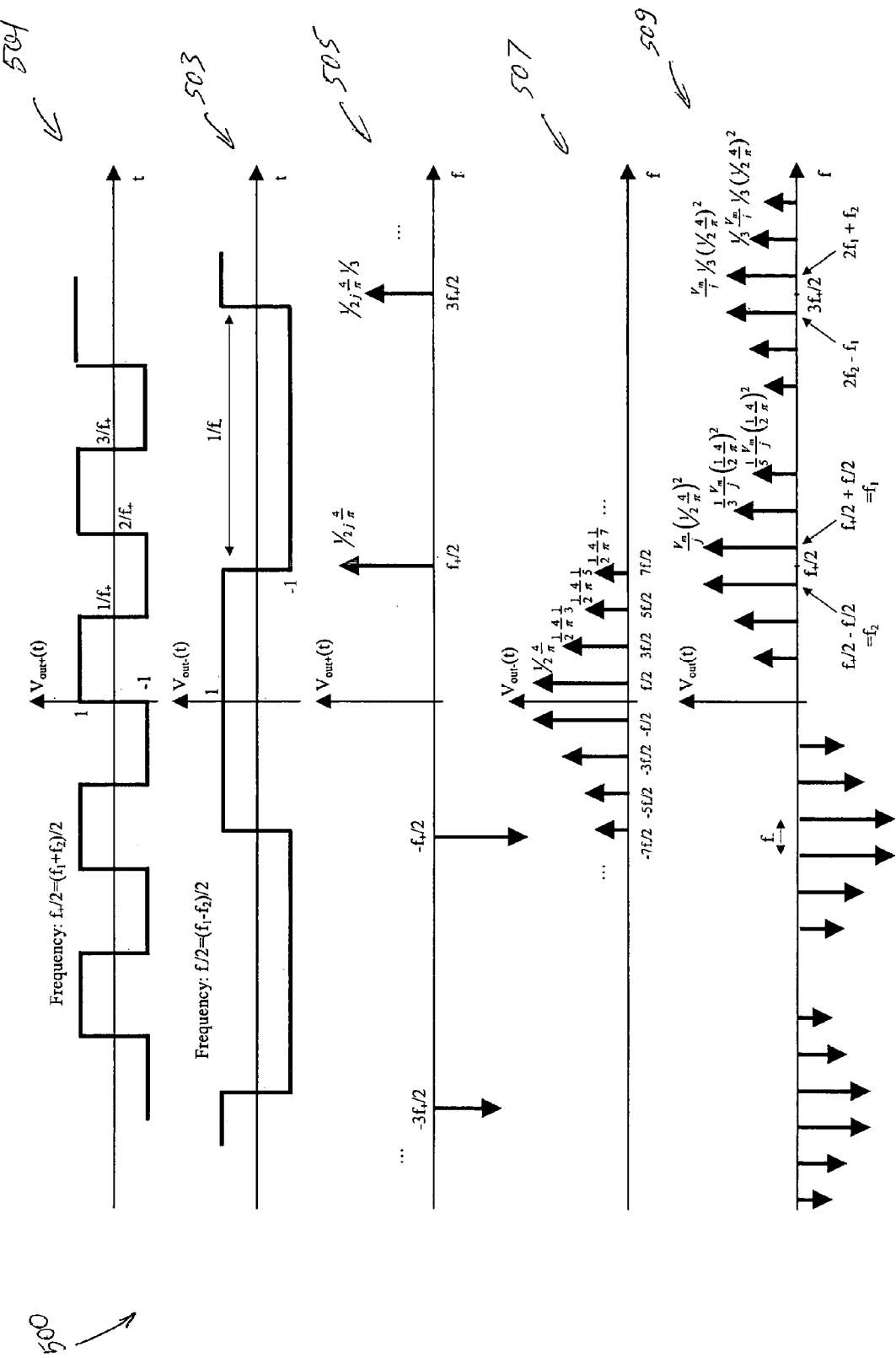
FIG. 5 is a graphical representation of output voltage components and output voltage of the limiter in FIG. 4, in accordance with an embodiment of the invention.

FIG. 5 is a graphical representation 500 of output voltage components and output voltage of the limiter in FIG. 4, in accordance with an embodiment of the invention. Referring to FIG. 5, for the case of $\theta=0$, the output voltage components $V_{out+}$ and $V_{out-}$ may be represented by the graphical representations 501 and 503, respectively. The output voltage components $V_{out+}$ and $V_{out-}$ in frequency domain may be represented by the graphical representations 505 and 507, respectively. The total output voltage component $V_{out}$ may be represented in frequency domain by the graphical representation 509.

Convolution of each impulse in the $V_{out+}$ spectrum with $V_{out-}$ may create a replica of the entire $V_{out-}$ spectrum around that impulse. Thus, the general shape of the spectrum of $V_{out}$ is a set of replicas of $V_{out-}$ spectrum, spaced by odd multiples of $f_+/2=(f_1+f_2)/2$. The overlap of the replicas may or may not be substantial depending on the relative difference between $f_1$ and $f_2$. The overlap is not shown here for clarity. The spectrum may scale linearly with $V_m$. In addition, there may be smaller impulses repeated at multiples of $f_-$ from the two impulses at $f_1$ and $f_2$. A similar pattern may occur at $3f_+/2$, $5f_+/2$, etc. It may be noticed from the graphical representation 500 that of the total output power of $V_m^2$, approximately one third may go into each of the two fundamental frequencies $f_1$ and $f_2$. In one aspect of the invention, the above convolution equation for obtaining $V_{out}$ may be utilized to predict phase noise harmonics, for example, within a sinusoidal signal with a phase noise profile.

Figure 6:
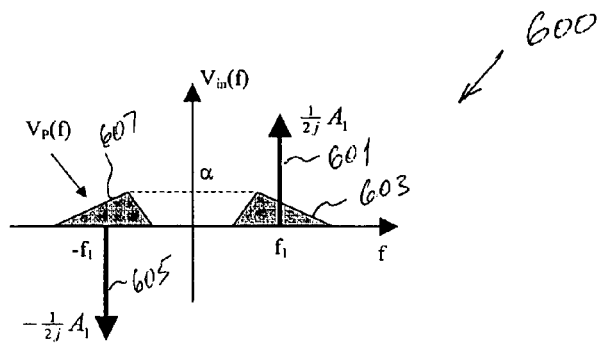
FIG. 6 is a graphical representation of noise profile and voltage for an input signal of the limiter in FIG. 4, in accordance with an embodiment of the invention.

FIG. 6 is a graphical representation 600 of noise profile and voltage for an input signal of the limiter in FIG. 4, in accordance with an embodiment of the invention. Referring to FIG. 6, an input signal $V_{in}$ may comprise a large signal 601, or a carrier, with a mirror image 605, and a small signal 603 with a mirror image 607. The small signal 603 may comprise a small sinusoidal wave:

$$V_{in}(t) = A_1 \sin(2\pi f_1 t) + A_2 \sin(2\pi f_2 t + \theta) \qquad (17)$$

The small sinusoid 603 may be regarded as noise, which may be represented by $V_P(t)$:

$$V_{in} = A_1 \sin(2\pi f_1 t) + V_P(t) \qquad (18)$$

Figure 7:
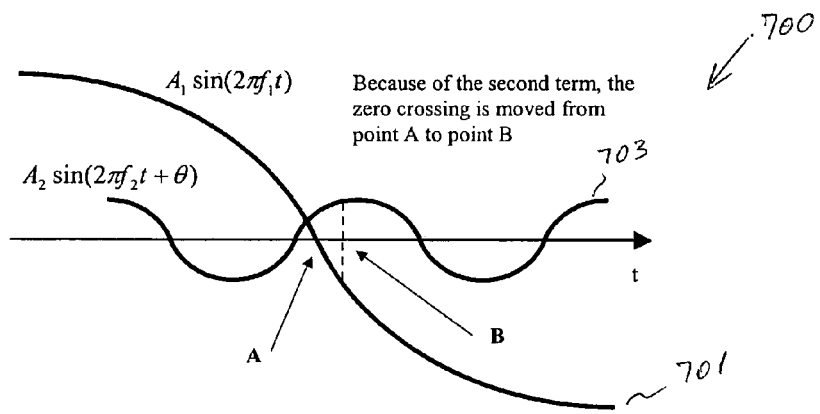
FIG. 7 is a graphical representation of a large sinusoidal signal and a small sinusoidal signal applied to a limiter, in accordance with an embodiment of the invention.

FIG. 7 is a graphical representation of a large sinusoid signal and a small sinusoidal signal applied to a limiter, in accordance with an embodiment of the invention. Referring to FIG. 7, the large sinusoidal signal 701 may have a zero crossing at point A. The perturbation 703 may move the zero crossing of the sinusoidal signal 701 from point A to point B. In order to obtain the spectrum of the output of a limiter, the limiter may be approximated as a high gain amplifier that saturates at the positive and negative supply levels, or as a soft limiter.

Figure 8:
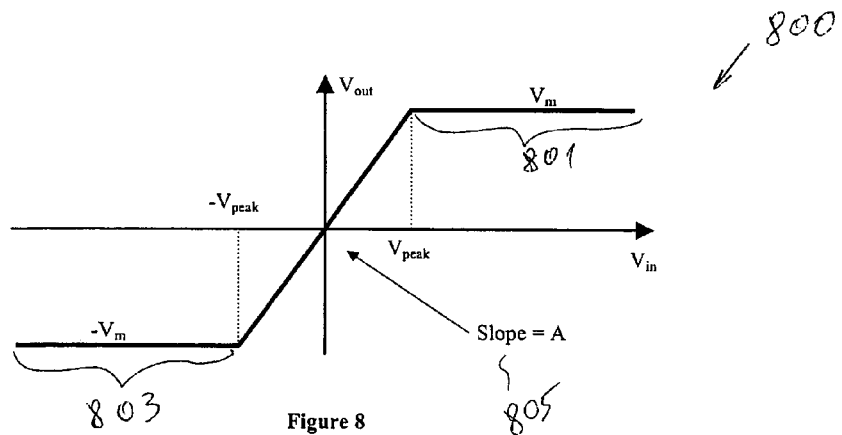
FIG. 8 is a graphical representation of a soft limiter, in accordance with an embodiment of the invention.

FIG. 8 is a graphical representation 800 of a soft limiter, in accordance with an embodiment of the invention. If a pure sinusoidal wave were applied to the high gain amplifier, the output may be approximated to a square wave, with flat sections 801 and 803. During transitions, the output would be an amplified version of the input, with a gain of A, which is the slope 805.

Figure 9:
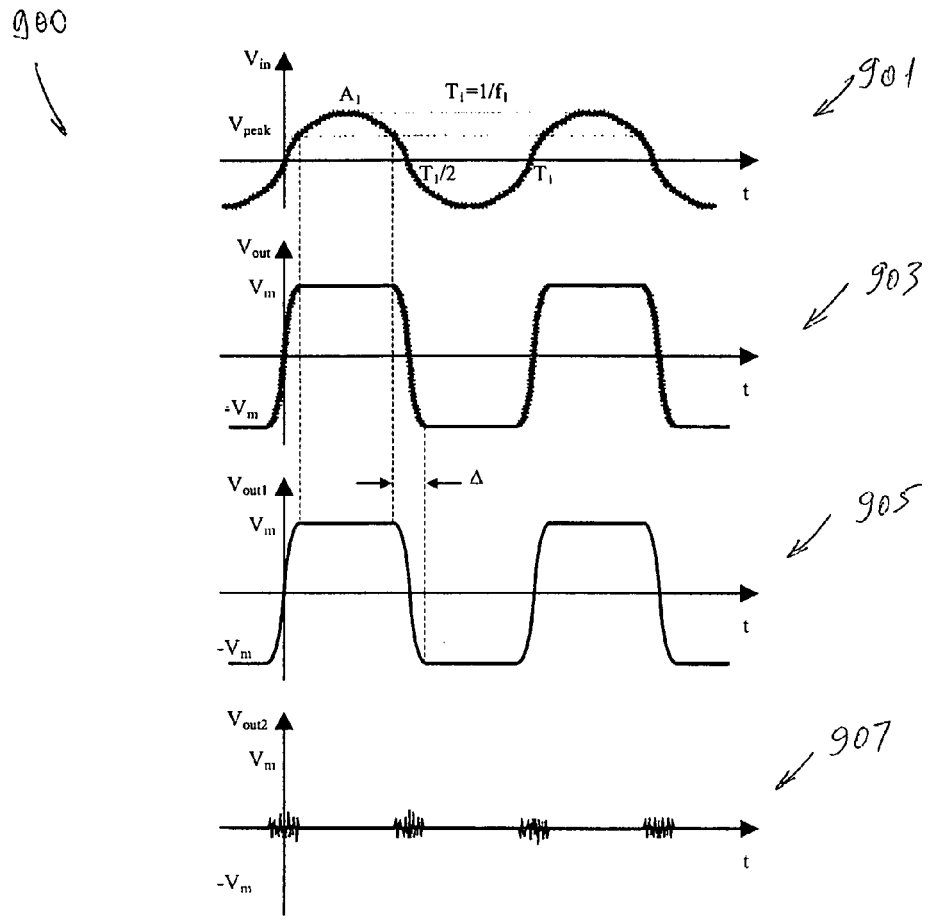
FIG. 9 is a graphical representation of output voltage for the limiter in FIG. 8, in accordance with an embodiment of the invention.

FIG. 9 is a graphical representation 900 of output voltage for the limiter in FIG. 8, in accordance with an embodiment of the invention. Referring to FIG. 9, graphical representation 901 illustrates the input signal, which may comprise a sinusoidal wave plus a small perturbation. The output signal $V_{out}$ may be illustrated by the graphical representation 903. The output signal $V_{out}$ may be decomposed into components $V_{out1}$ and $V_{out2}$, such that $V_{out}=V_{out1}+V_{out2}$, as illustrated on graphical representation 900. The transition time $\Delta$ may be obtained from:

$$A_1 \sin\left(2\pi f_1 \frac{\Delta}{2}\right) \cdot A = V_m \qquad (19)$$

$$\Delta = \frac{1}{\pi f_1} \sin^{-1}\left(\frac{V_m}{AA_1}\right) \qquad (20)$$

For small $\Delta$, or for $$\Delta \ll \frac{1}{\pi f_1}:$$

$$\Delta \approx \frac{1}{\pi f_1} \cdot \frac{V_m}{AA_1} \qquad (21)$$

$V_{out2}$ may be represented by the graph 907 as a chopped version of the small input perturbation, multiplied by A.

Figure 10:
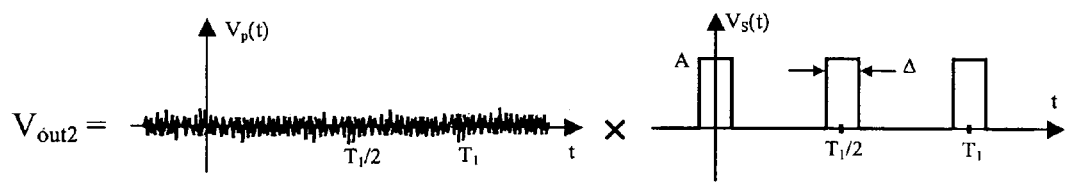
FIG. 10 is a graphical representation of a noise component for the output voltage of FIG. 9, in accordance with an embodiment of the invention.

FIG. 10 is a graphical representation 1000 of a noise component for the output voltage of FIG. 9, in accordance with an embodiment of the invention. Referring to FIG. 10, the output voltage component $V_{out2}$ may be further decomposed into the product of $V_P(t)$ and a sampling function $V_S(t)$. Therefore, the output voltage may be presented as:

$$V_{out}(t) = V_{out1}(t) + V_{out2}(t) = V_{out2}(t) + V_P(t) \times V_S(t) \qquad (22)$$

$$V_{out}(f) = V_{out1}(f) + V_P(f) * V_S(f) \qquad (23)$$

Figure 11:
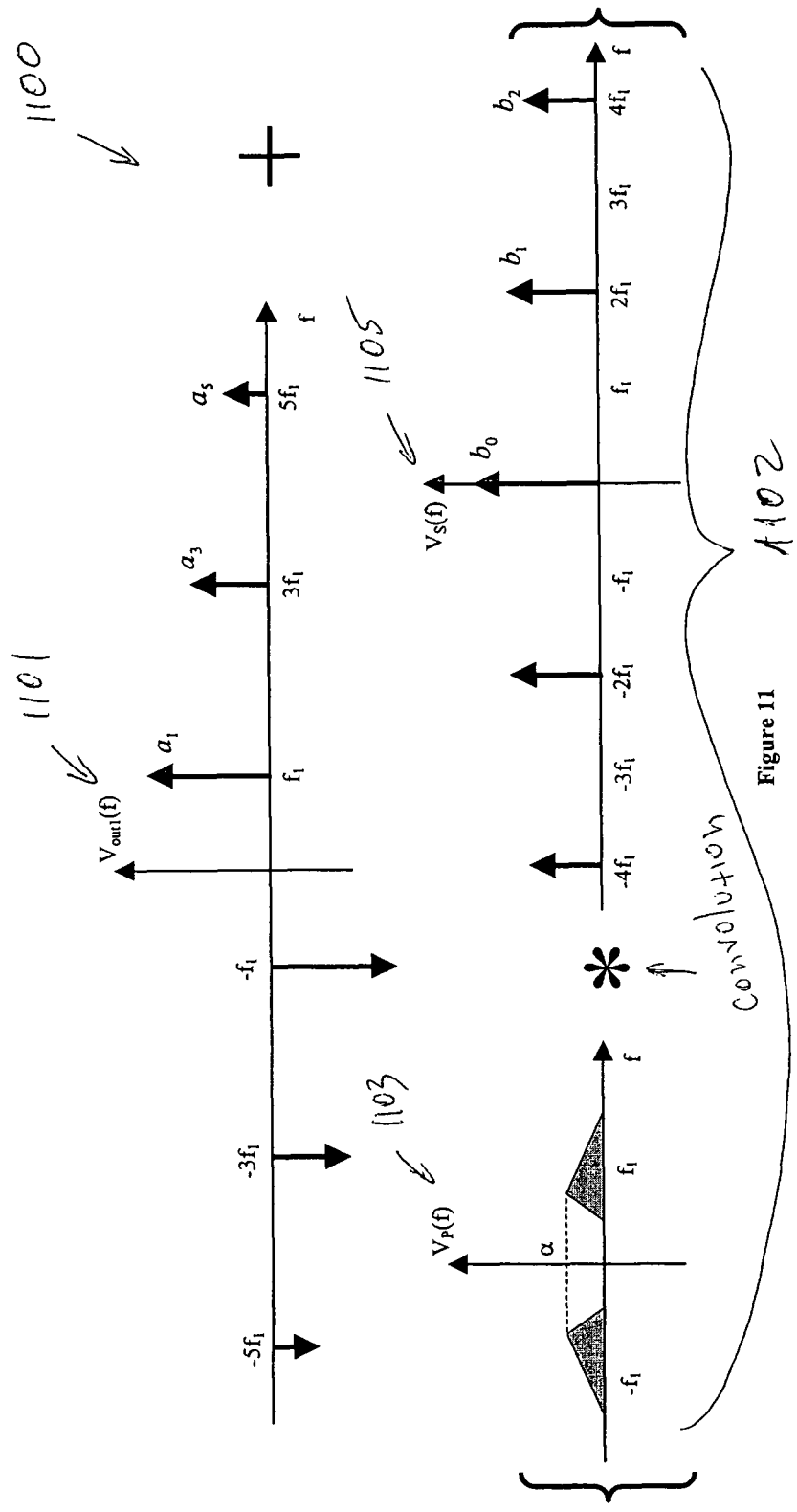
FIG. 11 is a graphical representation in frequency domain of the output voltage of FIG. 9, in accordance with an embodiment of the invention.

FIG. 11 is a graphical representation 1100 in frequency domain of the output voltage of FIG. 9, in accordance with an embodiment of the invention. Referring to FIG. 11, the output voltage $V_{out}$ may be represented as the sum of two components—1101 and 1102. The first component 1101 may be represented by a periodic signal with the fundamental frequency of $f=f_1$. This signal may represent what the output would look like in the absence of any small perturbation at the input. A Fourier transform of this signal may comprise impulses at odd harmonics of $f_1$. The second component 1102 may be a sampled version of the small perturbation, at a sampling frequency equal to $2f_1$.

In this way, the output spectrum may be broken down as follows:

$$V_{out1}(f) = \sum_{k=-\infty}^{\infty} a_k \delta(f - kf_1) \tag{24}$$

$$a_k = \begin{cases} 0 & \text{if } k = \text{even} \\ \frac{1}{2j} \cdot \left(2f_1 A A_1 \left(\Delta - \frac{\sin(2\pi f_1 \Delta)}{2\pi f_1}\right) + \frac{4V_m}{\pi} \cos(\pi f_1 \Delta)\right) & \text{if } k = 1 \\ \frac{1}{2j} \cdot \left(2f_1 A A_1 \left(\frac{\sin((k-1)\pi f_1 \Delta)}{(k-1)\pi f_1} - \frac{\sin((k+1)\pi f_1 \Delta)}{(k+1)\pi f_1}\right) + \frac{4V_m}{\pi k} \cos(k\pi f_1 \Delta)\right) & \text{otherwise} \end{cases} \tag{25}$$

For a small $\Delta$, equation 125 may be simplified to:

$$a_k = \frac{1}{2j} \cdot \frac{1}{k} \cdot \frac{4V_m}{\pi} \text{ (odd } k\text{)} \tag{26}$$

Equation (26) may be a very close approximation as $a_k(\Delta)$ is flat around $A=0$, when $$\left. \frac{\partial a_k}{\partial \Delta} \right|_{\Delta=0} = 0.$$

Similarly, $$V_S(f) = \sum_{k=-\infty}^{\infty} b_k \delta(f - k(2f_1)) \tag{27}$$

$$b_0 = 2Af_1\Delta \text{ and } b_k = \frac{A}{k\pi} \sin(2k\pi f_1 \Delta) \text{ } (k > 0) \tag{28}$$

As the limiter becomes more ideal and $A \to \infty$ and $\Delta \to 0$, $V_S(t)$ may turn into an impulse train, for which:

$$b_k \approx \frac{A}{k\pi} 2k\pi f_1 \Delta = 2Af_1\Delta \tag{29}$$

For a small $\Delta$:

$$b_k \approx 2Af_1 \cdot \frac{1}{\pi f_1} \cdot \frac{V_m}{AA_1} = \frac{2V_m}{\pi A_1} \tag{30}$$

Figure 12:
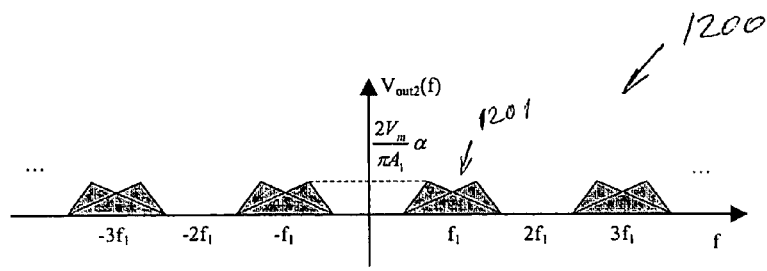
FIG. 12 is a graphical representation of perturbation spectrum of output voltage component of the output voltage of FIG. 9, in accordance with an embodiment of the invention.

FIG. 12 is a graphical representation 1200 of perturbation spectrum of output voltage component of the output voltage of FIG. 9, in accordance with an embodiment of the invention. Referring to FIG. 12, the output voltage component $V_{out2}(f)$ may comprise replicas of the input small perturbation spectrum 1201 repeated every $2f_1$. The replicas may be scaled by $2V_m/(\pi A_1)$, and they may also be folded onto each other. The output voltage may be presented as:

$$V_{out}(f) = \sum_{k=odd} a_k \delta(f - kf_1) + V_P(f) * \sum_{k=-\infty}^{\infty} b_k \delta(f - k(2f_1)) \tag{31}$$

$$V_{out}(f) = \sum_{k=odd} a_k \delta(f - kf_1) + \sum_{k=-\infty}^{\infty} b_k V_P(f - k(2f_1)) \tag{32}$$

Figure 13:
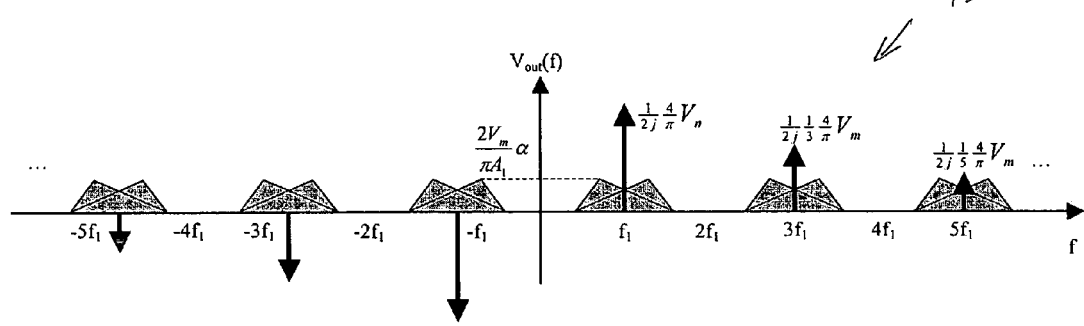
FIG. 13 is a graphical representation in frequency domain of output voltage from a limiter with a single side band perturbation in the input signal, in accordance with an embodiment of the invention.

FIG. 13 is a graphical representation 1300 in frequency domain of output voltage from a limiter with a single side band perturbation in the input signal, in accordance with an embodiment of the invention. Referring to FIG. 13, the output voltage may be represented by:

$$V_{out}(f) = \sum_{k=odd} \frac{4V_m}{2jk\pi} \delta(f - kf_1) + \frac{2V_m}{\pi A_1} \sum_{k=-\infty}^{\infty} V_P(f - k(2f_1)) \tag{33}$$

With regard to passing a signal with phase noise profile through a limiter, the output of the limiter may be represented as the sum of two components. The first part may comprise a square wave at $f=f_1$, which is what the output spectrum would be in the absence of any small perturbation. The second part may comprise a sampled version of the small perturbation, at a sampling frequency equal to $2f_1$. Because of the sampling action, the mirrored spectrum of the perturbation may fold on top of itself, around the odd multiples of the carrier frequency.

In this way, a single sideband perturbation (SSB) may occupy only one single sideband of the carrier as there is energy only on one side of the carrier and its total bandwidth is smaller than $f_1$. Consequently, if the carrier to SSB ratio at the input is:

$$R_{input} = \frac{A_1/2}{\alpha}, \tag{34}$$

then at the output, the ratio of carrier to each SSB becomes:

$$R_{output} = \frac{\frac{V_m}{2\pi}}{\frac{2V_m}{\pi A_1}\alpha} = 2R_{input}, \tag{35}$$

as illustrated on FIG. 13. Therefore, the carrier to each sideband ratio may be reduced but with a resulting increase in the sidebands.

Figure 14:
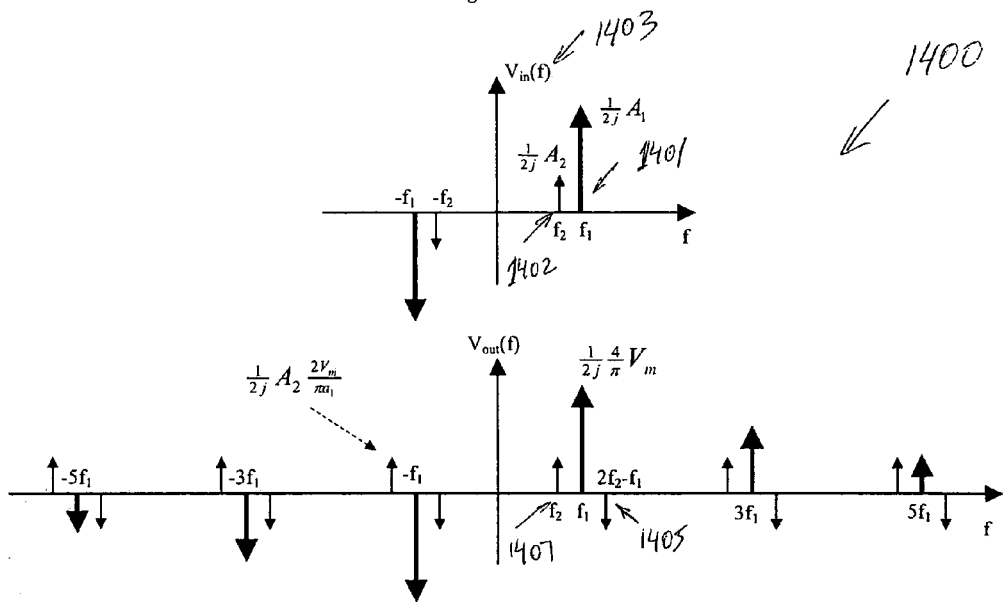
FIG. 14 is a graphical representation in frequency domain of input and output voltage from a limiter with a single side band perturbation in a sinusoid input signal, in accordance with an embodiment of the invention.

FIG. 14 is a graphical representation 1400 in frequency domain of input and output voltage from a limiter with a single side band perturbation in a sinusoid input signal, in accordance with an embodiment of the invention. Referring to FIG. 14, the input signal 1403 may comprise a sum of one large sinusoidal wave 1401 and one small sinusoidal wave 1402. At the input, the carrier frequency may be at $f=f_1$, the single sideband may be at $f=f_2$, and the carrier to sideband ratio may be $A_1/A_2$. At the output, the sideband 1402 may be split into two smaller sidebands 1407, at $f=f_2$, and 1405, at $f=2f_2-f_1$. The carrier to sideband ratio for each sideband may be $(A_1/A_2)/2$. In this way, the additive AM may be converted into PM sidebands, as indicated earlier. Analytical expressions may be derived if A is not large, using the formulas for $a_n$ and $b_n$ coefficients in $V_{out1}(f)$ and $V_S(f)$.

Figure 15:
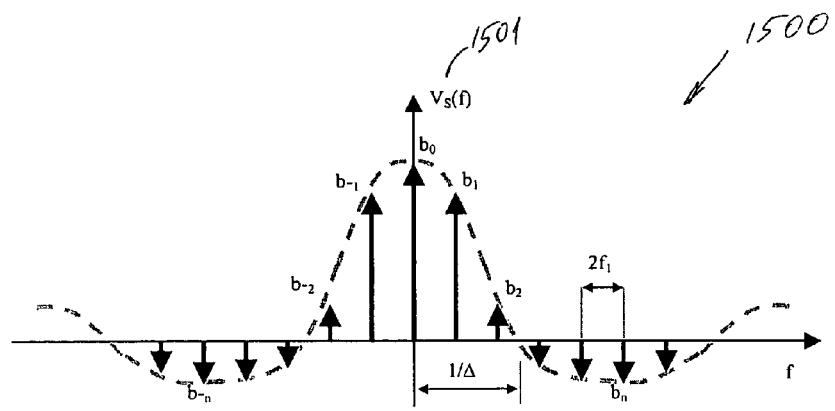
FIG. 15 is a graphical representation in frequency domain of a sampling function component within output voltage from a limiter, in accordance with an embodiment of the invention.

FIG. 15 is a graphical representation 1500 in frequency domain of a sampling function component within output voltage from a limiter, in accordance with an embodiment of the invention. Referring to FIG. 15, if A is finite and, therefore, $\Delta$ is non-zero, the sampling signal $V_S(t)$ 1501 may comprise a series of diminishing impulses in frequency domain with a sinc-shape envelope. The impulses may be spaced by $2f_1$ and the sinc zeros may be at multiples of $1/\Delta$. If the zeros of the sinc coincide with the impulses, when $2f_1=1/\Delta$ and $\Delta=T_1/2$, then $V_S(f)$ may be reduced to a single impulse of magnitude A at $f=0$. Under these conditions, $V_{out1}=0$. The output voltage may then be presented as:

$$V_{out}(f)=0+V_{in}(f)*V_x(f)=A \cdot V_{in}(f) \quad (36)$$

Such result may be expected since when $\Delta=T_1/2$, the input waveform may be small, so that the limiter may not saturate and may be always in its linear regime. Therefore, the signal may be amplified with a gain of A.

Figure 16:
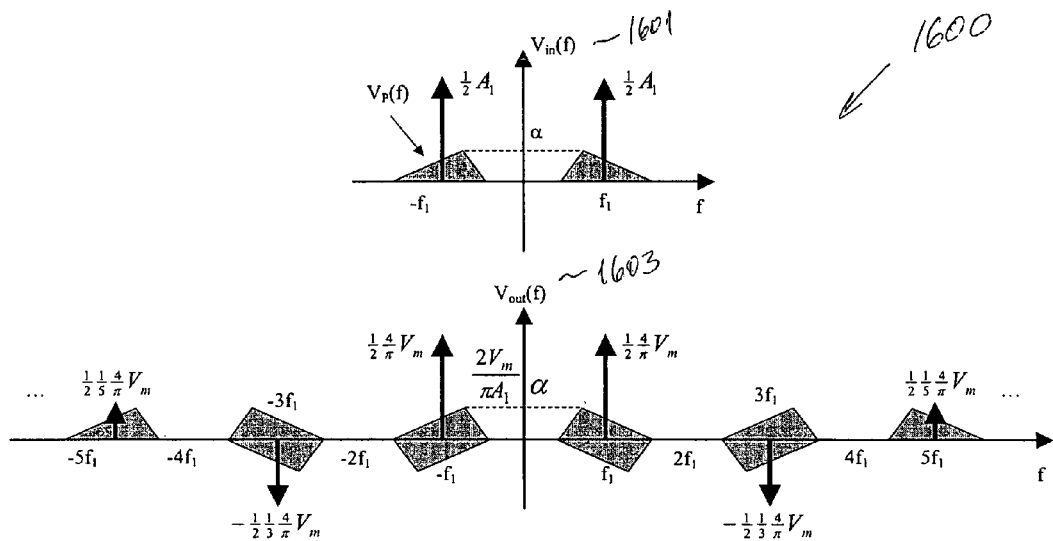
FIG. 16 is a graphical representation in frequency domain of input and output voltage from a limiter with a single side band perturbation in a cosine input signal, in accordance with an embodiment of the invention.

FIG. 16 is a graphical representation 1600 in frequency domain of input and output voltage from a limiter with a single side band perturbation in a cosine input signal, in accordance with an embodiment of the invention. Referring to FIG. 16, the input signal 1601 may comprise a cosine input signal with a single side band perturbation.

Figure 17:
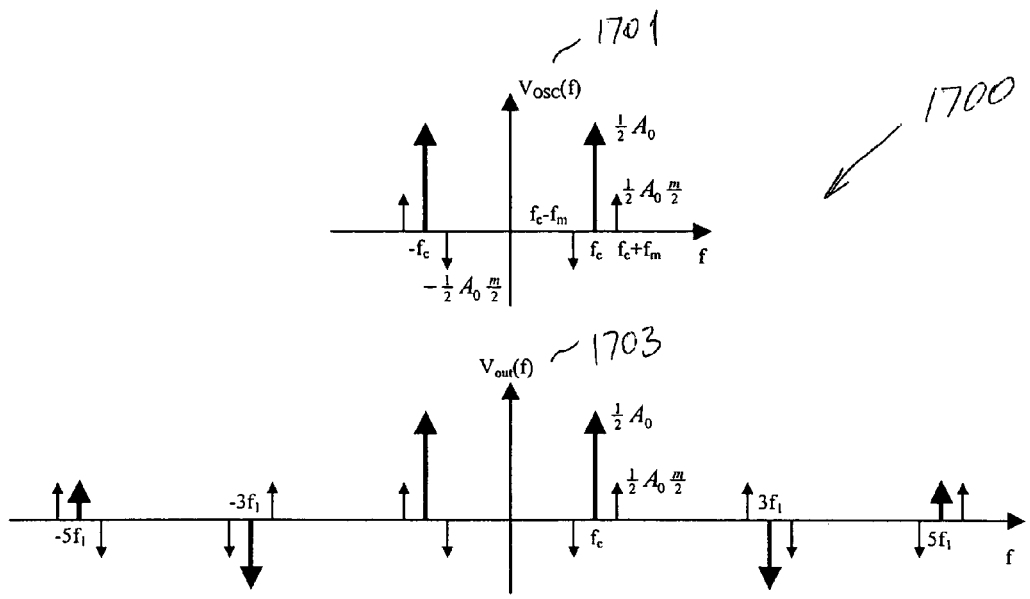
FIG. 17 is a graphical representation in frequency domain of oscillation input with PM and output voltage from a limiter, in accordance with an embodiment of the invention.

FIG. 17 is a graphical representation in frequency domain of oscillation input with PM and output voltage from a limiter, in accordance with an embodiment of the invention. Referring to FIG. 17, the input signal $V_{OSC}$ 1701 may comprise an oscillation with a small PM modulation in cosine form, and may be represented by:

$$V_{OSC}(t)=A_0 \cos(2\pi f_c t + m \sin 2\pi f_m t) \quad (37)$$

$$V_{OSC}(t) \approx A_0 \cos 2\pi f_c t + A_0 \frac{m}{2}[\cos 2\pi(f_c+f_m)t - \cos 2\pi(f_c-f_m)t] \quad (38)$$

The output signal $V_{out}$ 1703 may be obtained by utilizing the information in FIG. 16. For simplicity, it may be assumed, for example, that $4V_m/\pi=A_0$, or the gain for the cosine wave at $f_c$ is equal to 1.

Figure 18:
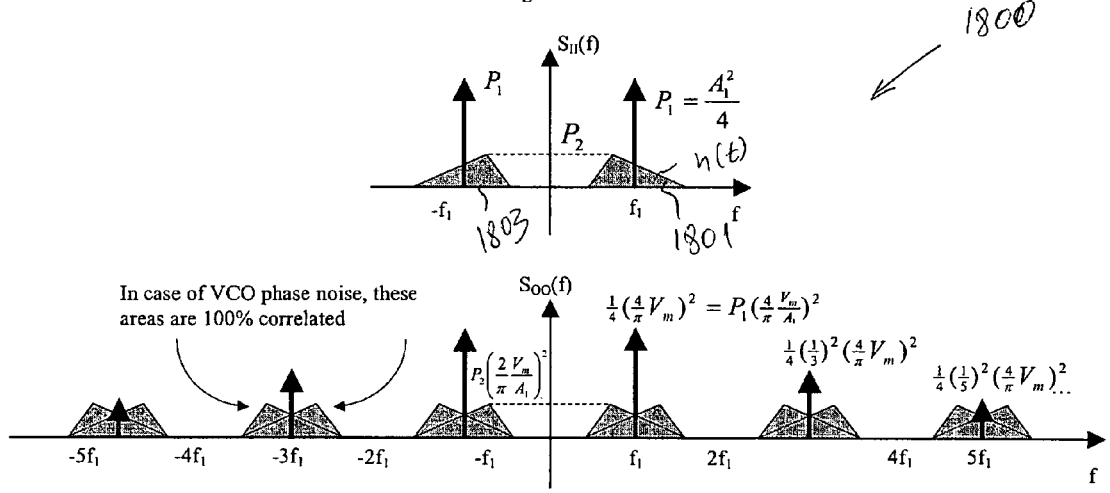
FIG. 18 is a graphical representation in frequency domain of power spectral density of a limiter input of a large sinusoid with a random process and a limiter output, in accordance with an embodiment of the invention.

FIG. 18 is a graphical representation 1800 in frequency domain of power spectral density of a limiter input of a large sinusoid with a random process and a limiter output, in accordance with an embodiment of the invention. Referring to FIG. 18, the random process n(t) 1801 may be represented as noise, for example, with relatively small amplitude and a given power spectral density $S_{nn}(t)$. The PSD of the small perturbation 1801 and its mirrored version 1803 may be repeated around odd multiples of the carrier. The parts of the PSD that fold on top of each other may not be randomly added up. In case of a Fourier transform of deterministic signals, when adding two spectrums, the phase information may correctly sum the amplitudes. Similarly, to correctly add power spectral densities, information regarding their correlation may be utilized. If two random processes x(t) and y(t) are added to form a random process z(t), the resulting PSD may be represented by:

$$S_{ZZ}(f)=F(R_{ZZ}(\tau))=F(E[z(t) \cdot z(t+\tau)]) \quad (39)$$

$$S_{ZZ}(f)=F(E[(x(t)+y(t)) \cdot (x(t+\tau)+y(t+\tau))]) \quad (40)$$

$$S_{ZZ}(f)=F(E[(x(t)x(t+\tau)]+E[y(t)y(t+\tau)]+E[(x(t)y(t+\tau)]+E[x(t+\tau)y(t)]) \quad (41)$$

If the two processes x(t) and y(t) are uncorrelated, the last two terms in the Fourier transform may be reduced to zero:

$$S_{ZZ}(f)=F(E[(x(t)x(t+\tau)])+F(E[y(t)y(t+\tau)]) \quad (42)$$

$$S_{ZZ}(f)=S_{XX}(f)+S_{YY}(f) \quad (43)$$

If the signals are correlated, the above equation may not hold. In particular, if $y(t)=\alpha x(t)$, then:

$$S_{ZZ}(f)=(1+\alpha)^2 S_{XX}(f) \quad (44)$$

If two areas of the power spectrum which are 100% correlated, or their underlying random processes are the same and act in the same direction, fold onto each other, the resulting PSD may not double, but may quadruple, according to the above formula.

If a large sinusoidal wave is accompanied by wideband thermal noise, according to FIG. 18, the thermal noise may fold on top of itself for every convolution with the impulses in the sampling function. If the thermal noise is not bandlimited, it may fold on itself an infinite number of times. Since the areas that fold on each other are uncorrelated, the PSDs may add up directly and subsequently the result may become infinite.

Thermal noise, however, is mostly bandlimited. Thus, in the process of hard-limiting, the noise may fold onto itself only a limited number of times. A limiter, therefore, may increase the thermal noise level if it has a relatively wide band. It may be shown that if a large sinusoidal wave accompanied by a bandlimited thermal noise is passed through a limiter, the output PSD of noise on the left side, from $f=0$ to $f=f_c$, and the right side, from $f=f_c$ to $f=2f_c$, of the carrier may be correlated.

Figure 19:
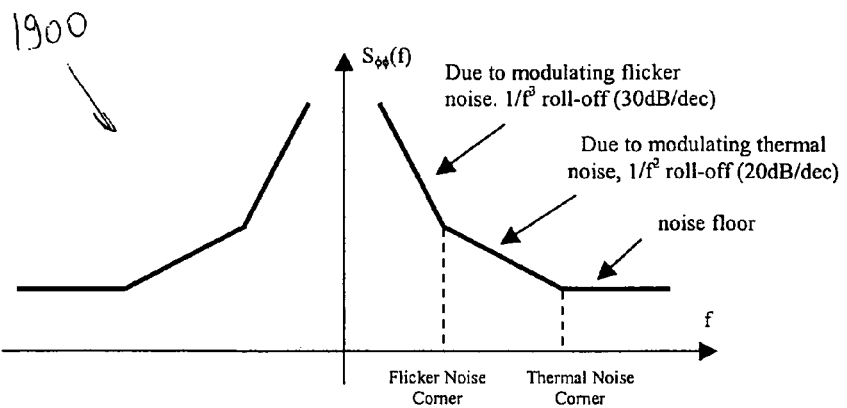
FIG. 19 is a graphical representation of power spectral density of phase noise of a voltage controlled oscillator, in accordance with an embodiment of the invention.

FIG. 19 is a graphical representation 1900 of power spectral density of phase noise of a voltage controlled oscillator, in accordance with an embodiment of the invention. The output signal in a typical integrated VCO may be represented by:

$$x(t)=A \cos(2\pi f_1 t+\phi(t)) \quad (45)$$

Where the term $\phi(t)$ may reflect the phase variation due to the noise sources in the VCO. Referring to FIG. 19, there is illustrated the power spectral density of phase noise $S_{\phi\phi}(f)$. A VCO by definition is a phase integrator and, therefore, the power spectral density of the VCO output phase, in terms of the input modulating process, may be represented by:

$$S_{\phi\phi}(f)=\frac{K_V^2}{f^2}S_H(f), \quad (46)$$

where $K_V$ may be the VCO constant. If the modulating noise mechanism is a combination of thermal and flicker noise, for f>0, $S_H(f)$ may be written as:

$$S_H(f) = \frac{A}{f} + N_{Th1} \quad (47)$$

Therefore, the output phase noise only due to $S_H(f)$ may equal:

$$S_{\phi\phi}(f) = \frac{K_V^2 A_f}{f^3} + \frac{K_V^2 N_{Th1}}{f^2} \quad (48)$$

If it were only due to the modulating mechanisms, the noise profile of the output would be indefinitely descending. However, there may be thermal noise sources that may not modulate the VCO, but may directly appear at the output. An example of such a noise source may be the thermal noise of the series resistance of the inductor in an integrated VCO. This may not be noise in the phase but rather an additive amplitude noise. However, the phase and amplitude noises may appear similarly in a PSD measurement on a spectrum analyzer. Therefore, for f>0 a term may be added to the PSD to account for the thermal noise floor:

$$S_{\phi\phi}(f) = \frac{K_V^2 A_f}{f^3} + \frac{K_V^2 N_{Th1}}{f^2} + N_{Th2} \quad (49)$$

Even though the AM and PM components may be indistinguishable in a PSD, there may be a difference between these components. The true PM noise that is caused by the modulation of the VCO phase may create symmetrical and correlated sidebands, whereas the additive AM noise floor may not be necessarily correlated on the left and right sides of the carrier, unless it is converted to PM through hard-limiting, for example. Referring again to FIG. 19, in a typical VCO noise profile, the $1/f^3$ and $1/f^2$ areas on the left and right sides of the carrier may, therefore, be correlated.

Although the thermal noise added, for example, by tank loss is uncorrelated with respect to the two sides of the carrier, it may still be possible to have correlated thermal noise sideband through other mechanisms.

Figure 20:
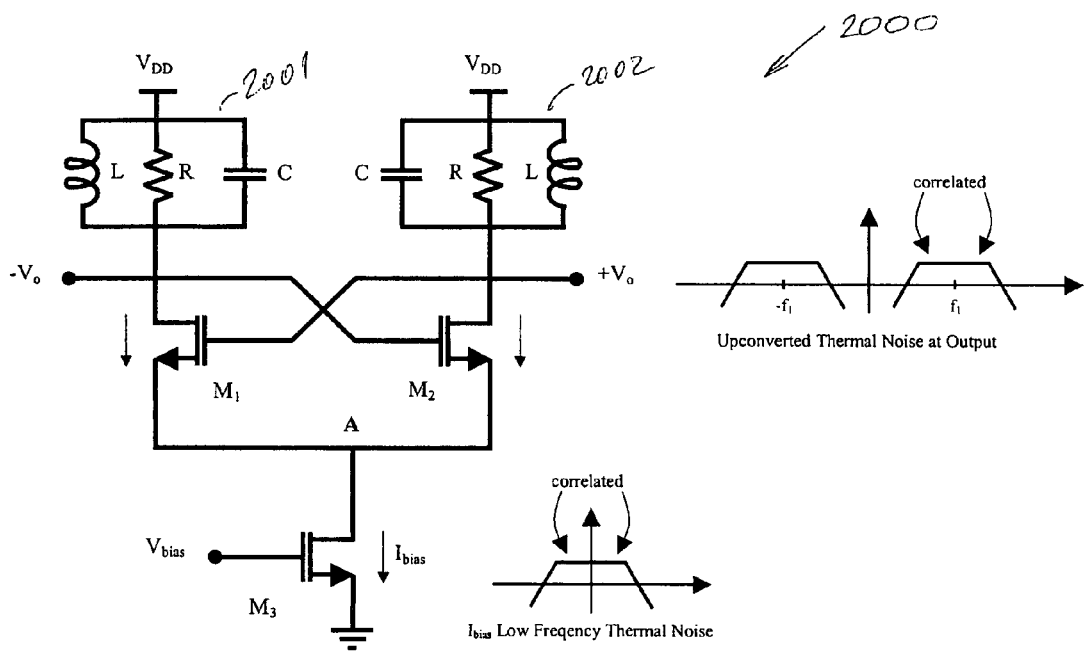
FIG. 20 is a schematic block diagram of a voltage controlled oscillator that may be utilized in accordance with an embodiment of the invention.

FIG. 20 is a schematic block diagram of a voltage controlled oscillator (VCO) 2000 that may be utilized in accordance with an embodiment of the invention. The VCO 2000 may comprise L-R-C circuits 2001 and 2002, transistors M1 and M2, and a grounded transistor M3. The cross-coupled transistors M1 and M2 may provide a negative resistance that may cancel out the resonance tank loss lumped into resistors R. Transistor M3 may provide the bias current. The thermal noise of resistors R may directly appear at the output and may be uncorrelated with respect to the sides of the carrier.

During operation, transistors M1 and M2 may turn on and off in every cycle of oscillation. This action may alternate the bias current between the two sides of the oscillator 2000 and may be similar to the mixing action that may occur in an integrated mixer. The low frequency thermal noise of M3 may be up-converted to around $f_1$, or the oscillation frequency, and may create correlated sideband. Because of the parasitic capacitance at node A, the thermal noise of M3 may have a finite cut-off frequency that may or may not cause folding of the noise spectrum onto itself. In any event, the sideband at the output due to the noise source may be correlated. Thus, part of the thermal noise at the output coming from resistors R may be uncorrelated with respect to the left and right sides of the carrier, while the part coming from transistor M3 may be correlated in that regard. The thermal far-end noise of an integrated VCO, therefore, may be neither completely correlated nor uncorrelated.

Referring again to FIG. 18, if the output of a VCO is hard-limited, the noise spectrum profile may be repeated at odd multiples of the oscillator frequency. The immediate vicinity of the $f_1$ oscillation frequency, or the $1/f^3$ and $1/f^2$ areas, may be correlated with respect to the left and right sides of the carrier. At any odd multiple of $f_1$, the phase noise spectrum and its mirrored version may be folded onto each other. The close-in phase noise and its mirrored version may, therefore, pass to the output with a gain of $$\left(\frac{2V_m}{\pi A_1}\right)^2$$

and may add to each other. Because the two side bands are correlated, the result may be four times the power of one of them. In this way, the close-in phase noise gain may be $$4\left(\frac{2V_m}{\pi A_1}\right)^2.$$

The power at $f_1$ at the output may be $$P_1\left(\frac{4V_m}{\pi A_1}\right)^2,$$

which may indicate that the gain for the carrier from input to the output may also equal $$4\left(\frac{2V_m}{\pi A_1}\right)^2.$$

Therefore, the ratio of the carrier to sideband ratios may not change around $1/f^3$ and $1/f^2$. In addition, phase noise at the output may remain the same as the input.

With regard to the thermal noise, it may depend on the level of correlation of sidebands and its bandwidth. Depending on where the noise floor is coming from, the thermal noise may start to fall off at some point. Even if the VCO noise profile extended to infinity, it may become bandlimited upon entering the limiter because of the limited input bandwidth of the limiter. The band limit may be M times the oscillation frequency of the VCO, which means the thermal noise folds onto itself M times. Therefore:

$$N_{Th} = 4N_{Th1} \cdot \left(\frac{2V_m}{\pi A_1}\right)^2 + (M-2)N_{Th1} \cdot \left(\frac{2V_m}{\pi A_1}\right)^2 \quad (50)$$

The first term on the right hand side of the equation comes from the fact that the correlated left and right sides, the sides close to carrier, may fold on top of each other once. The (M−2) replicas that fold back near the carrier may be uncorrelated. Equation (50) may be simplified to:

$$N_{Th} = (M+2)N_{Th1} \cdot \left(\frac{2V_m}{\pi A_1}\right)^2 \quad (51)$$

For example, if M=2, the thermal noise may fold onto itself only twice, for correlated folding, and therefore the thermal noise floor may pass through with a gain of $$4\left(\frac{2V_m}{\pi A_1}\right)^2.$$

The far-end phase noise may also stay the same as the input. In this way, if the noise profile has a larger bandwidth, more folding of thermal noise may occur and the thermal noise level may relatively increase. In the general case of M>2, if the output signal of a VCO is applied to a high gain limiter, the close-in phase noise at the output of the limiter may remain the same, and the thermal noise floor may increase, depending on the effective bandwidth of the original noise profile.

In one aspect of the invention, a filter may be utilized in accordance with an amplifier in order to filter out phase noise prior to amplifying the signal and folding a phase noise harmonic on top of itself.

Figure 21:
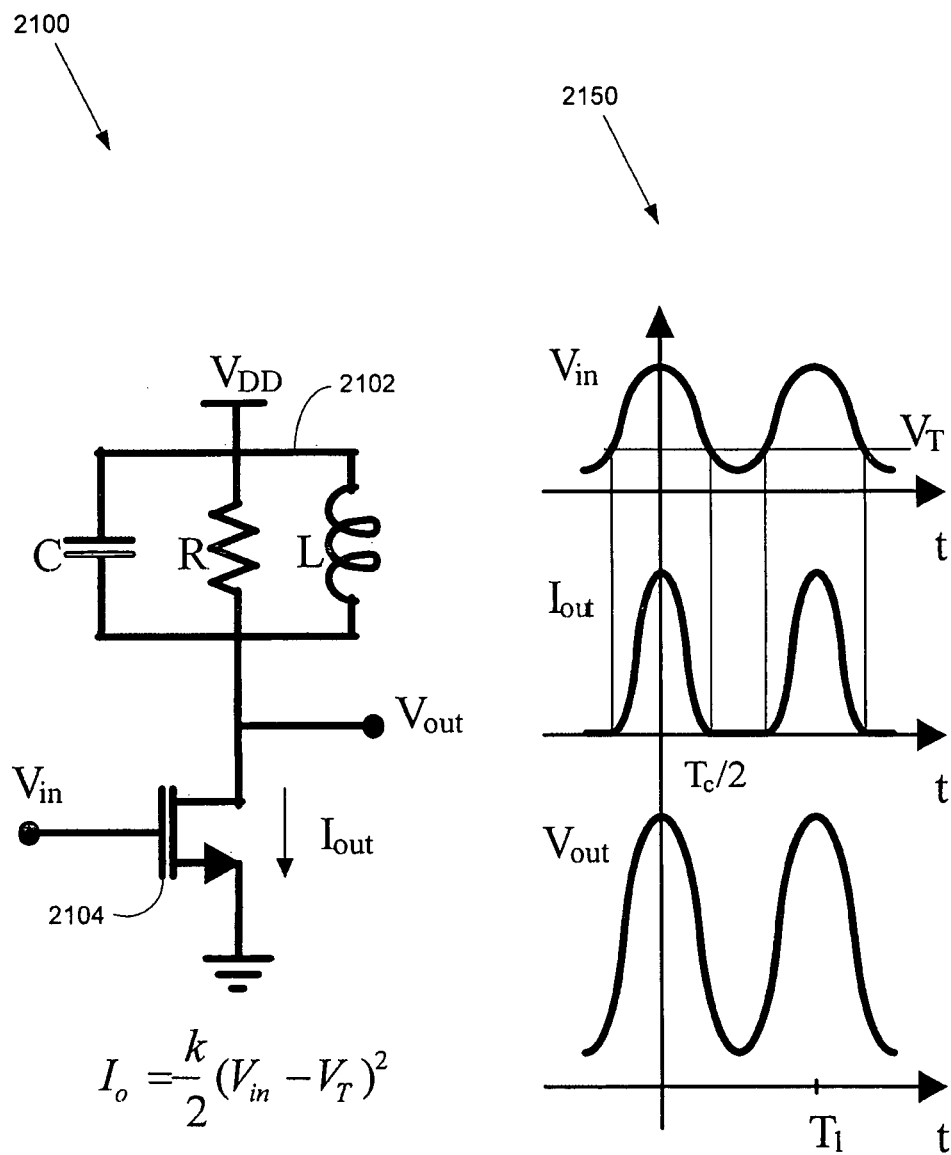
FIG. 21 is a schematic block diagram of a CMOS tuned amplifier that may be utilized in accordance with an embodiment of the invention.

FIG. 21 is a schematic block diagram of a CMOS tuned amplifier that may be utilized in accordance with an embodiment of the invention. Referring to FIG. 21, the CMOS tuned amplifier 2100 may comprise a C-R-L circuit 2102 and a transistor 2104. The transistor 2104 may comprise an NMOS transistor, for example. The input voltage $V_{in}$, output voltage $V_{out}$, and the output current $I_{out}$ for the CMOS tuned amplifier 2100 may be characterized by the respective graphs on diagram 2150.

In operation, the voltage to be amplified may be applied to the input $V_{in}$. When the input voltage, or the threshold voltage of the NMOS transistor 2104, is smaller than $V_T$, the current at the output $I_{out}$ is zero. The output current may be calculated utilizing the following equation:

$$I_o = \frac{k}{2}(V_{in} - V_T)^2$$

The output current, therefore, may correspond to a second order periodic signal at the same frequency as the input voltage, as reflected on diagram 2150. The current may then be applied to a resonance tank, such as the C-R-L circuit 2102, that may extract the fundamental frequency of the current, which may correspond to the amplified version of the input sine wave into the amplifier 2100. The DC bias voltage of the input may determine the conduction angle, or the fraction of period, in radians, when the transistor 2104 conducts and the output current is not zero. In order to achieve higher linearity within the CMOS tuned amplifier 2100, the conduction angle may be increased. However, for higher power efficiency, the conduction angle may be decreased.

In one aspect of the invention, the CMOS tuned amplifier 2100 design parameters, such as conduction angle, may be determined utilizing linearity and gain requirements. Once a conduction angle is determined, the output current may be calculated utilizing the following equation:

$$I_o = \prod(T_c, T_1) \cdot \frac{k}{2}(V_i - V_T)^2$$

In the above equation, the gate function, $\Pi$, may correspond to a square wave with width $T_c$ and period $T_1$, where the conduction time $T_c$ may correspond to the time that the transistor 2104 is on in each cycle and $T_1$ may correspond to the period of the input signal. The Fourier Transform of this signal may comprise impulses spaced by $f_1$, or the fundamental frequency of the signal. The relative amplitude of the impulses may depend on the conduction angle. $\Pi$ may, therefore, be decomposed into a series of impulses in the frequency domain utilizing the following equations:

$$\prod(T_c, T_1) = \sum_{k=-\infty}^{\infty} b_k \delta\left(f - \frac{k}{T_1}\right), \text{ where}$$

$$b_0 = \frac{T_c}{T_1} \text{ and } b_k = \frac{1}{k\pi}\sin\left(k\pi\frac{T_c}{T_1}\right) \ (k > 0)$$

The output current $I_{out}$ may then be determined in frequency domain utilizing the following equations:

$$I_{out}(f) = F\left\{\prod(T_c, T_1)\right\} * F\left\{\frac{k}{2}(V_{in} - V_T)^2\right\}$$

$$I_{out}(f) = \left\{\sum_{k=-\infty}^{\infty} b_k \delta\left(f - \frac{k}{T_1}\right)\right\} * F\left\{\frac{k}{2}(V_{in} - V_T)^2\right\}$$

Depending on the design parameters of the CMOS tuned amplifier 2100, the output current spectrum may be characterized by various shapes. In an exemplary aspect of the invention, the transistor 2104 may be always on. In this case, $T_c$ is equal to $T_1$. The output current $I_{out}$ may then be determined utilizing the following equation:

$$I_{out}(f) = F\left\{\frac{k}{2}(V_{in} - V_T)^2\right\}$$

Figure 22:
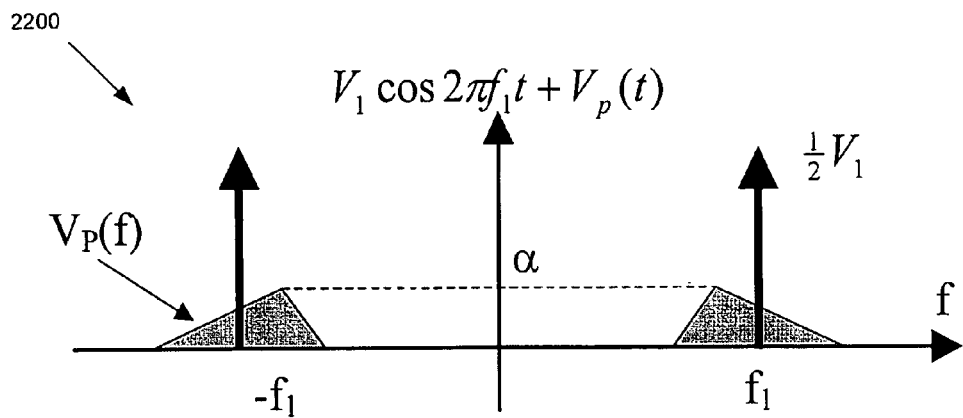
FIG. 22 is a graphical representation of an exemplary amplifier input spectrum, in accordance with an embodiment of the invention.

FIG. 22 is a graphical representation 2200 of an exemplary amplifier input spectrum, in accordance with an embodiment of the invention. Referring to FIGS. 21 and 22, the input to amplifier 2100 may be represented as a DC level voltage, a sinusoid and a small perturbation. The input voltage $V_{in}$ may then be determined from the following equations:

$$V_{in}(t) = V_{bias} + V_1 \cos 2\pi f_1 t + V_P(t)$$

$$V_{in}(t) - V_T = V_{bias} - V_T + V_1 \cos 2\pi f_1 t + V_P(t)$$

And using a more compressed notation, such as $V_{in}(t) - V_T = V_0 + V_1 \cos 2\pi f_1 t + V_P(t)$, the following equation may be derived:

$$\frac{k}{2}(V_{in}(t) - V_T)^2 = \frac{k}{2}(V_0 + V_1\cos 2\pi f_1 t + V_P(t))^2$$

If the perturbation term is small, the second power of the perturbation may be ignored and the perturbation voltage in frequency domain, as well as the input voltage $V_{in}$, may be represented by the graphical depiction 2200. The following equations may then be derived:

$$\frac{k}{2}(V_{in}(t) - V_T)^2 \approx \frac{k}{2}(V_0^2 + V_1^2\cos^2 2\pi f_1 t +$$
$$2V_0 V_1 \cos 2\pi f_1 t + 2V_0 V_p(t) + 2V_1 \cos 2\pi f_1 t V_p(t))$$

$$\frac{k}{2}(V_{in}(t) - V_T)^2 = \frac{k}{2}\left(V_0^2 + \frac{V_1^2}{2} + \frac{V_1^2}{2}\cos 4\pi f_1 t + \right.$$
$$\left. 2V_0 V_1 \cos 2\pi f_1 t + 2V_0 V_p(t) + 2V_1 \cos 2\pi f_1 t V_p(t)\right)$$

To avoid the complications arising from aliasing, it may be assumed that the perturbation is characterized by a relatively limited bandwidth. The output current $I_{out}$ in frequency domain may be determined utilizing the following equation:

$$I_0(f) =$$

$$F\left\{\frac{k}{2}(V_{in}(t) - V_T)^2\right\} = \frac{k}{2}\begin{cases} \left(V_0^2 + \frac{V_1^2}{2}\right)\delta(f) \\ + \frac{V_1^2}{2}\left\{\frac{1}{2}\delta(f - 2f_1) + \frac{1}{2}\delta(f + 2f_1)\right\} \\ +2V_0 V_1\left\{\frac{1}{2}\delta(f - f_1) + \frac{1}{2}\delta(f + f_1)\right\} \\ +2V_0 V_p(f) \\ +2V_1\left\{\frac{1}{2}V_p(f - f_1) + \frac{1}{2}V_p(f + f_1)\right\} \end{cases}$$

Figure 23:
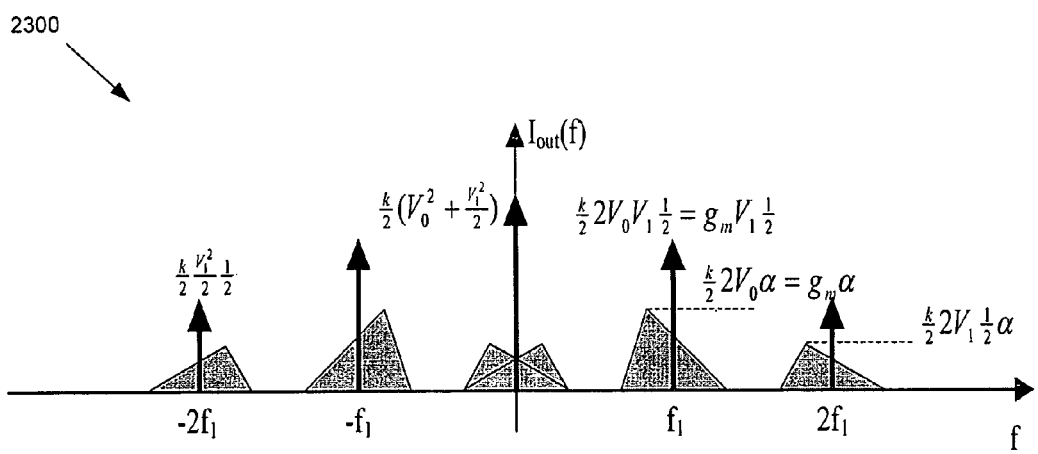
FIG. 23 is a graphical representation of an exemplary amplifier output spectrum including output current, in accordance with an embodiment of the invention.

FIG. 23 is a graphical representation of an exemplary amplifier output spectrum including output current, in accordance with an embodiment of the invention. Referring to FIG. 23, the graphical representation 2300 may depict the output current $I_{out}$ in frequency domain, as determined by the above equation. From the graph 2300 it may be determined that the noise spectrum spreads over at least twice the bandwidth of the input signal. Such noise spectrum may be used to characterize amplifiers with polynomial nonlinearity. The ratio of signal spectrum around the carrier signal to the perturbation is at a constant level and is equal to that of input. Both the fundamental frequency $f_1$ and the perturbation may be amplified with a gain of $g_m$, which may be achieved with an exemplary amplifier characterized by second order nonlinearity, for example. In more nonlinear amplification devices, the perturbation may be amplified at a larger gain than the carrier.

In a different aspect of the invention, if the conduction angle is less than a full period, the output current $I_{out}$ may be determined by the equation:

$$I_{out}(f) = \left\{\sum_{k=-\infty}^{\infty} b_k \delta(f - kf_1)\right\} * F\left\{\frac{k}{2}(V_{in} - V_T)^2\right\}$$

The output current, therefore, may be characterized by replicas of the spectrum of FIG. 23 spaced by $f_1$ in frequency. If the noise spectrum of FIG. 23 is not bandlimited to $f_1/2$, there may be considerable folding of spectra into the amplified signal. In order to avoid the folding of noise into the amplified signal, the noise profile of the input signal may be analyzed and one or more noise characteristics may be filtered prior to the amplification action.

Figure 24:
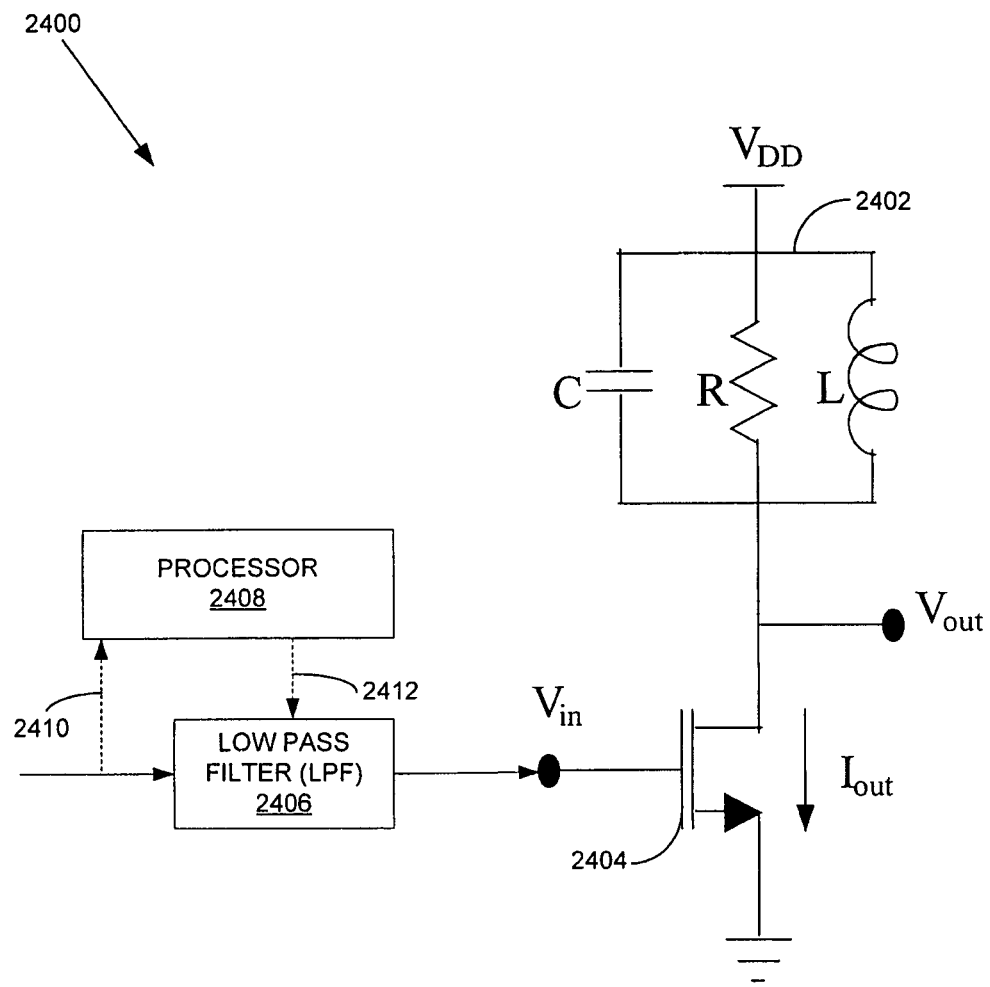
FIG. 24 is a schematic block diagram of a CMOS tuned amplifier utilizing noise spectrum analysis, in accordance with an embodiment of the invention.

FIG. 24 is a schematic block diagram of a CMOS tuned amplifier 2400 utilizing noise spectrum analysis, in accordance with an embodiment of the invention. Referring to FIG. 24, the CMOS tuned amplifier 2400 may comprise a C-R-L circuit 2402, a transistor 2404, a processor 2408, and a low-pass filter 2406. The transistor 2404 may comprise an NMOS transistor, for example. The amplifier 2400 may be characterized by input voltage $V_{in}$, output voltage $V_{out}$, and the output current $I_{out}$.

In operation, the amplifier 2400 may fold one or more spectrum noise characteristics of the incoming signal. In one aspect of the invention, the amplifier 2400 may utilize the processor 2408 to analyze the noise profile of the incoming signal 2410. The processor 2408 may comprise on-chip processor and may be configured to analyze spectral content of noise profile. In this manner, the processor 2408 may configure the low-pass filter 2406 by a control signal 2412 so that the low-pass filter 2406 may filter out one or more noise harmonics and avoid folding of those harmonics in the output signal after the amplifier 2400. The processor 2408 may also be a part of a portable analyzing device utilizing spectral analysis hardware, firmware and/or software, for example.

Figure 25:
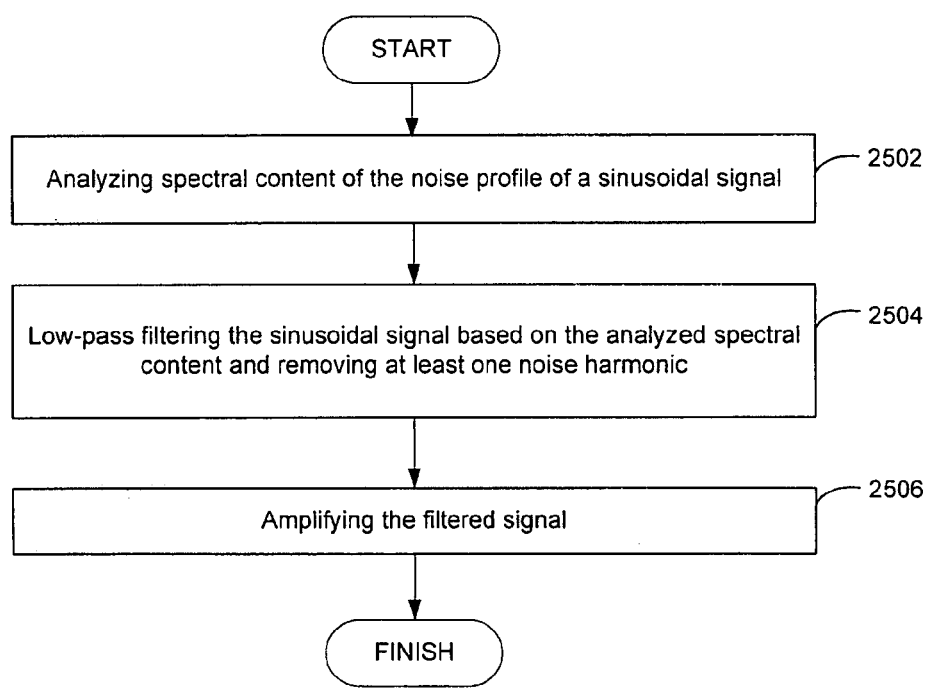
FIG. 25 is a flow diagram of an exemplary method for processing a sinusoidal wave signal with a phase noise profile, in accordance with an embodiment of the invention.

FIG. 25 is a flow diagram of an exemplary method 2500 for processing a sinusoidal wave signal with a phase noise profile, in accordance with an embodiment of the invention. At step 2502, spectral content of the noise profile of the modulated sinusoidal signal may be analyzed. For example, an on-chip processor, or a removable device, may be utilized to analyze the spectral content and one or more noise characteristics. At step 2504, the sinusoidal signal may be low-pass filtered to remove phase noise characteristics, prior to the signal being amplified. The spectral content analysis may be utilized to determine one or more filter coefficients which configure the low-pass filter. At step 2506, the filtered modulated signal may be amplified by an amplifier.

While the invention contemplates the application of a filter in accordance with a CMOS tuned amplifier, the invention is not limited in this way. A filter in accordance with an amplifier may also be applied to other circuits or arrangements with one or more different types of amplifiers so that a phase-noise profile of a signal may be reduced prior to the signal being amplified by an amplifier.

Accordingly, aspects of the invention may be realized in hardware, software, firmware or a combination thereof. The invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

The invention claimed is:

1. A method for processing a signal with a corresponding noise profile, the method comprising:
    analyzing spectral content of the noise profile;
    filtering at least one noise harmonic within the signal based on said analyzed spectral content; and
    amplifying said filtered signal, wherein the noise profile comprises a phase noise profile.

2. The method according to claim 1, further comprising determining at least one filter coefficient that is used to filter said at least one noise harmonic.

3. The method of claim 2, further comprising:
    analyzing spectral content of the signal;
    predicting spectral folding based on the spectral analysis of the signal; and
    determining the at least one filter coefficient to reduce the predicted spectral folding.

4. The method according to claim 1, wherein said filtering comprises low pass filtering.

5. The method according to claim 1, further comprising determining at least one non-linearity characteristic of the signal.

6. The method according to claim 5, further comprising low-pass filtering at least one noise harmonic within the signal based on said determined at least one non-linearity characteristic.

7. The method according to claim 5, wherein said at least one non-linearity characteristic comprises at least one of a noise harmonic frequency and a noise harmonic amplitude.

8. A system for processing a signal with a corresponding noise profile, the system comprising:
    a processor configured to:
        analyze spectral content of the noise profile;
    a filter that filters at least one noise harmonic within the signal based on said analyzed spectral content; and
    an amplifier that amplifies said filtered signal,
    wherein the noise profile comprises a phase noise profile.

9. The system according to claim 8, wherein said processor determines at least one non-linearity characteristic of the signal.

10. The system according to claim 9, wherein said filter low-pass filters at least one noise harmonic within the signal based on said determined at least one non-linearity characteristic.

11. The system according to claim 9, wherein said at least one non-linearity characteristic comprises at least one of a noise harmonic frequency and a noise harmonic amplitude.

12. The system of claim 8, wherein the amplifier comprises a CMOS transistor with a nonlinear response characterized by a threshold voltage.

13. The system of claim 8, further comprising:
    a tank circuit to tune the amplifier.

14. The system of claim 8, wherein the processor is further configured to:
    predict spectral folding at an output of the amplifier; and
    configure the filter to reduce the predicted spectral folding.

* * * * *